(12) United States Patent
Harder

(10) Patent No.: US 10,048,331 B2
(45) Date of Patent: Aug. 14, 2018

(54) DISPLACEABLE LOCAL COIL

(71) Applicant: Martin Harder, Nürnberg (DE)

(72) Inventor: Martin Harder, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 587 days.

(21) Appl. No.: 14/726,799

(22) Filed: Jun. 1, 2015

(65) Prior Publication Data

US 2015/0355296 A1    Dec. 10, 2015

(30) Foreign Application Priority Data

Jun. 4, 2014   (DE) .................... 10 2014 210 657

(51) Int. Cl.
*G01V 3/00*   (2006.01)
*G01R 33/34*   (2006.01)

(52) U.S. Cl.
CPC .. *G01R 33/34007* (2013.01); *G01R 33/34046* (2013.01); *G01R 33/34084* (2013.01)

(58) Field of Classification Search
CPC .............. G01R 33/34; G01R 33/34007; G01R 33/340084; G01R 33/34046; G01R 33/341; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/385; G01R 33/56358; A61B 5/055; A61B 5/0555; A61B 5/07
USPC ................................... 324/300–322
See application file for complete search history.

(56) References Cited

U.S. PATENT DOCUMENTS

| 5,066,915 A | 11/1991 | Omori et al. |
| 2002/0138001 A1* | 9/2002 | Kroeckel ......... G01R 33/34084 600/410 |
| 2008/0143332 A1* | 6/2008 | Hergt ................. G01R 33/3415 324/318 |
| 2008/0246479 A1 | 10/2008 | Kundner et al. |
| 2010/0052682 A1* | 3/2010 | Mueller ................. A61B 5/055 324/318 |

(Continued)

FOREIGN PATENT DOCUMENTS

| CN | 203275624 U | 11/2013 |
| DE | 10114013 A1 | 10/2002 |

(Continued)

OTHER PUBLICATIONS

German Office Action for German Application No. 10 2014 210 657.5, dated Apr. 13, 2015, with English Translation.

*Primary Examiner* — Thang Le
(74) *Attorney, Agent, or Firm* — Lempia Summerfield Katz LLC

(57) ABSTRACT

The embodiments relate to a local coil for an imaging magnetic resonance tomography system. The local coil includes at least one displacement facility for a displacement of at least part of the local coil along at least axes running, in particular, in the axial patient direction.

20 Claims, 10 Drawing Sheets

(56) References Cited

U.S. PATENT DOCUMENTS

| | | | |
|---|---|---|---|
| 2010/0182005 A1* | 7/2010 | Biber | A61B 5/064 324/307 |
| 2012/0326719 A1 | 12/2012 | Zink | |
| 2013/0219620 A1* | 8/2013 | Eder | A61B 6/0407 5/601 |
| 2013/0225980 A1 | 8/2013 | Biber et al. | |
| 2014/0187910 A1* | 7/2014 | Culver | A61B 6/4417 600/411 |

FOREIGN PATENT DOCUMENTS

| | | |
|---|---|---|
| DE | 10314215 B4 | 11/2006 |
| DE | 102007016314 B3 | 1/2009 |
| DE | 102010063724 B4 | 6/2012 |
| DE | 102012203083 A1 | 8/2013 |
| DE | 102012206921 B3 | 10/2013 |

* cited by examiner

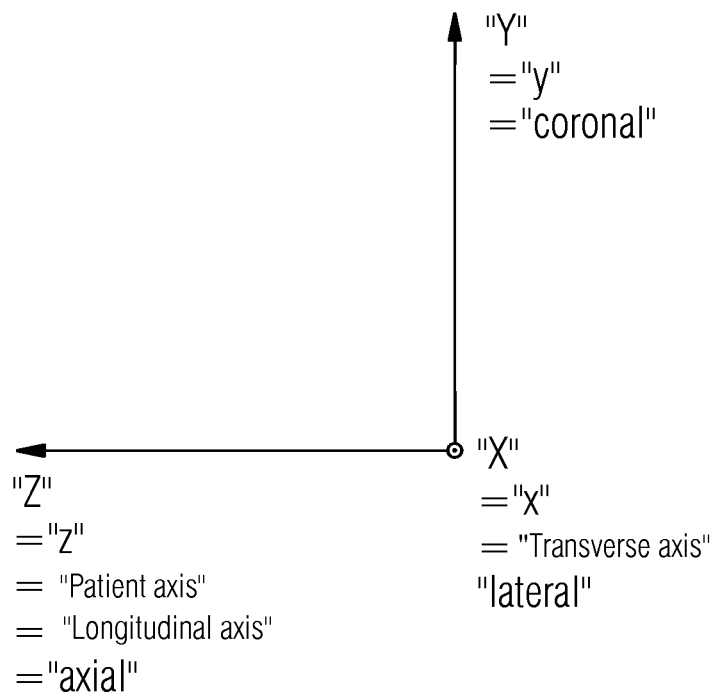

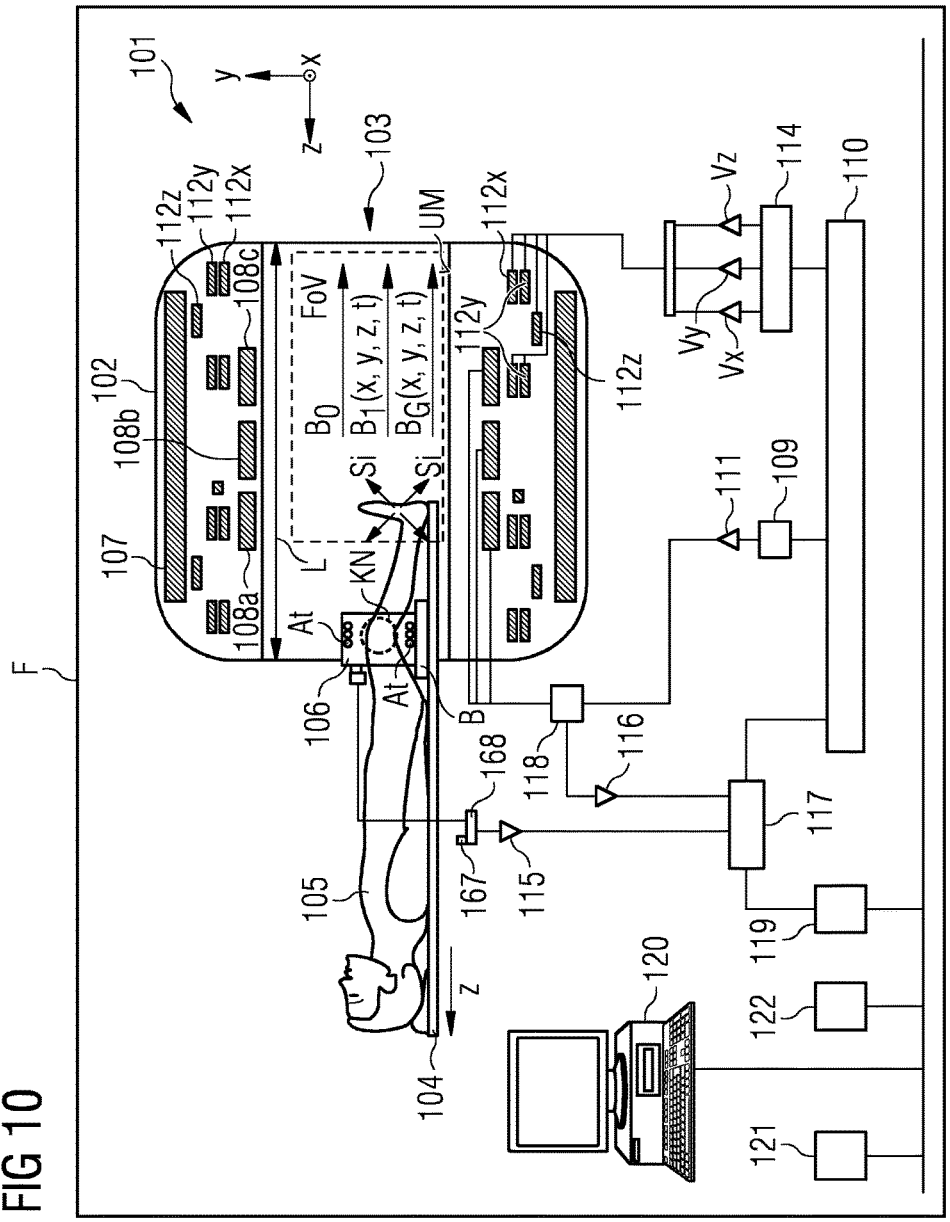

DISPLACEABLE LOCAL COIL

CROSS-REFERENCE TO RELATED APPLICATIONS

This application claims the benefit of DE 10 2014 210 657.5, filed on Jun. 4, 2014, which is hereby incorporated by reference in its entirety.

TECHNICAL FIELD

The embodiments relate to a local coil for a MRT system (e.g., a RF knee coil) that may be displaced at least in particular in the axial patient direction.

BACKGROUND

A magnetic resonance device (also known as MRT or MRT system) for examining objects or patients using magnetic resonance tomography is known, for example, from DE 103 14 215 B4.

SUMMARY

It is an object of the present embodiments to optimize a local coil, (e.g., a knee coil), for a MRT.

The scope of the present invention is defined solely by the appended claims and is not affected to any degree by the statements within this summary. The present embodiments may obviate one or more of the drawbacks or limitations in the related art.

BRIEF DESCRIPTION OF THE DRAWINGS

FIG. 9 depicts a schematic example of different coordinate systems for labeling the axes.

FIG. 10 depicts a schematic example of a MRT system.

DETAILED DESCRIPTION

Figure 1:
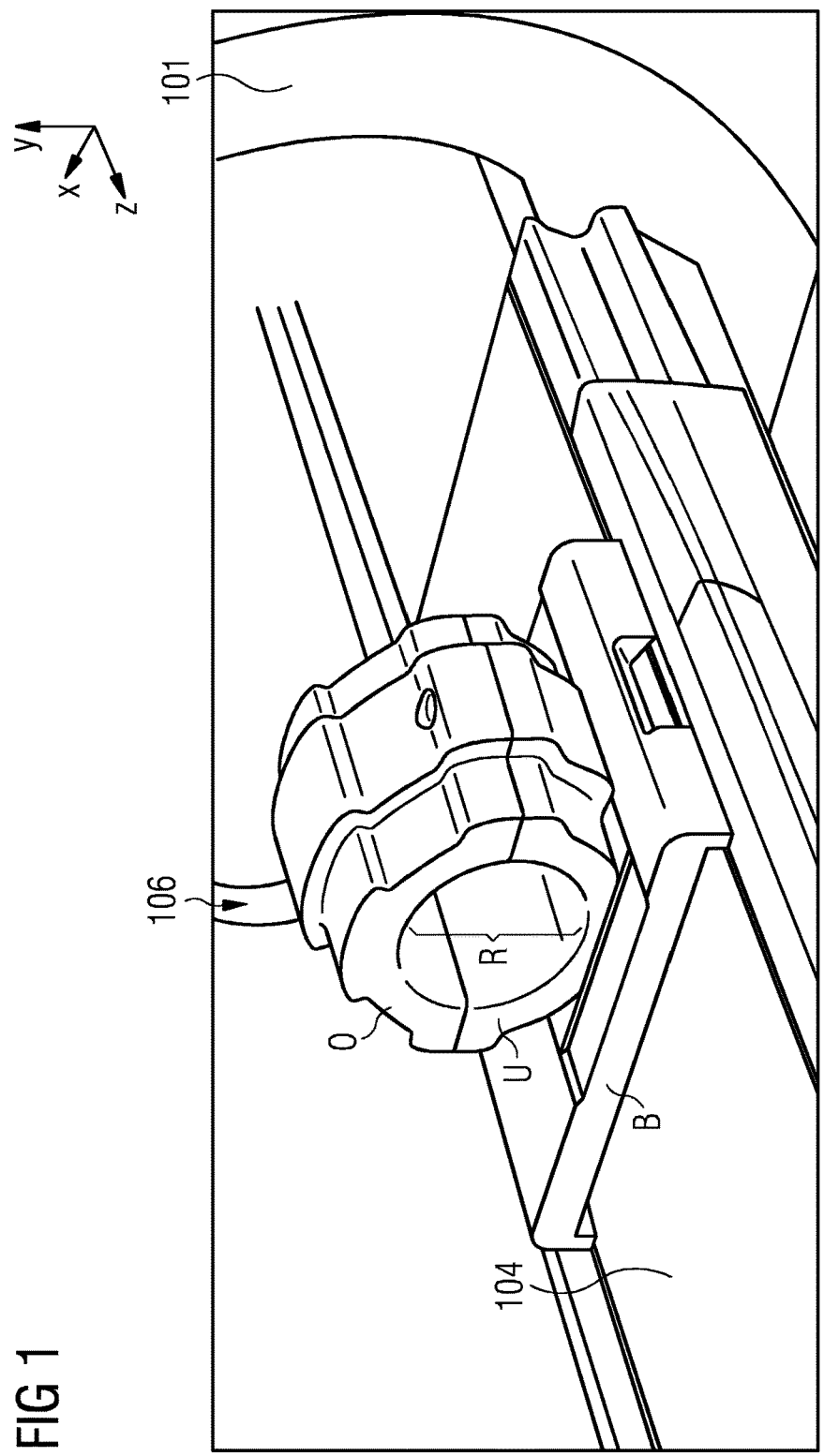
FIG. 1 depicts a perspective example of a knee coil on a patient couch of a MRT, in which a support of a patient, e.g., with his/her feet to the front with respect to an advance into the MRT bore is possible.
Figure 2:
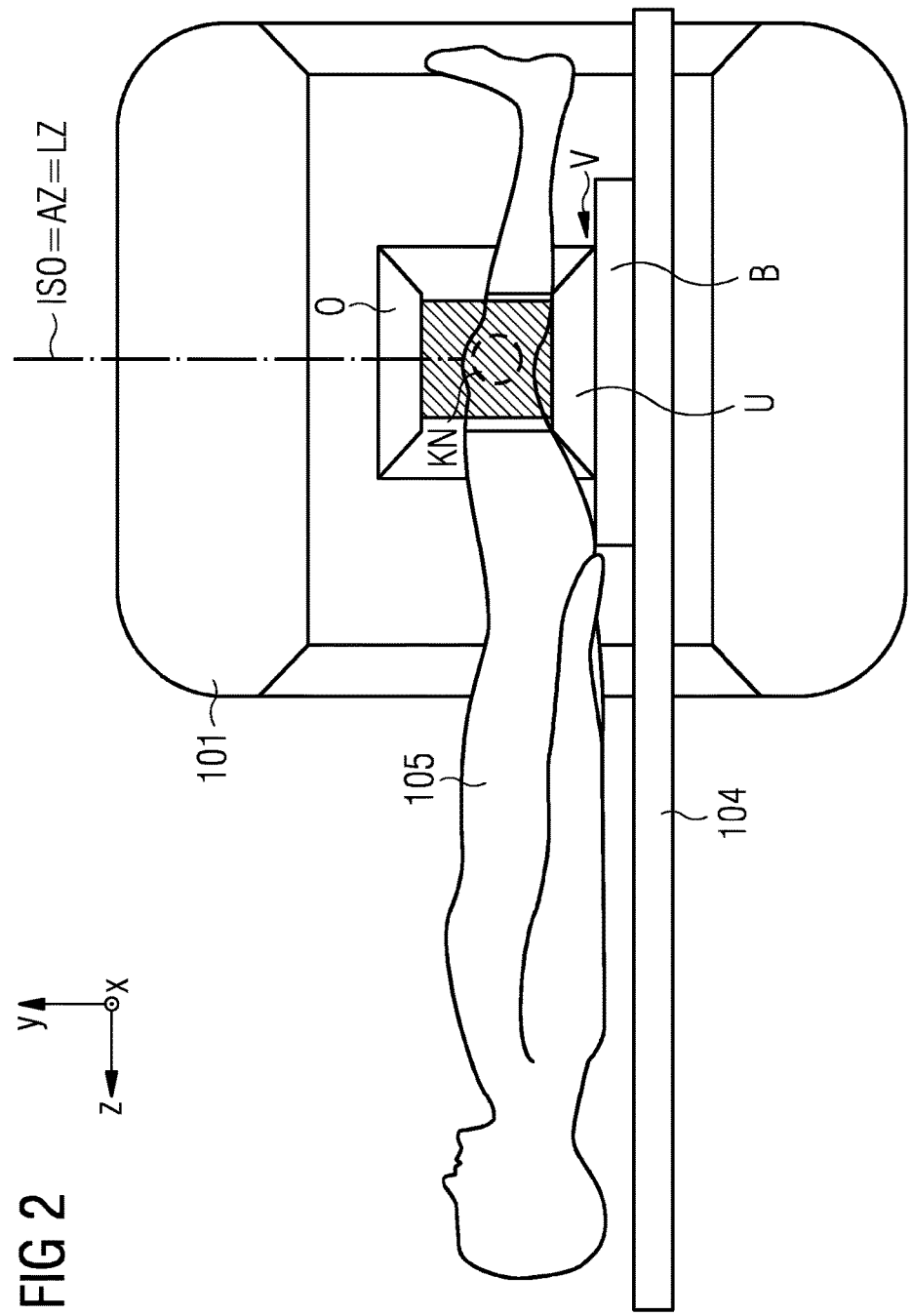
FIG. 2 depicts an example of a longitudinal section of a knee coil, wherein the knee coil and a knee are centered in the isocenter of a MRT.
Figure 3:
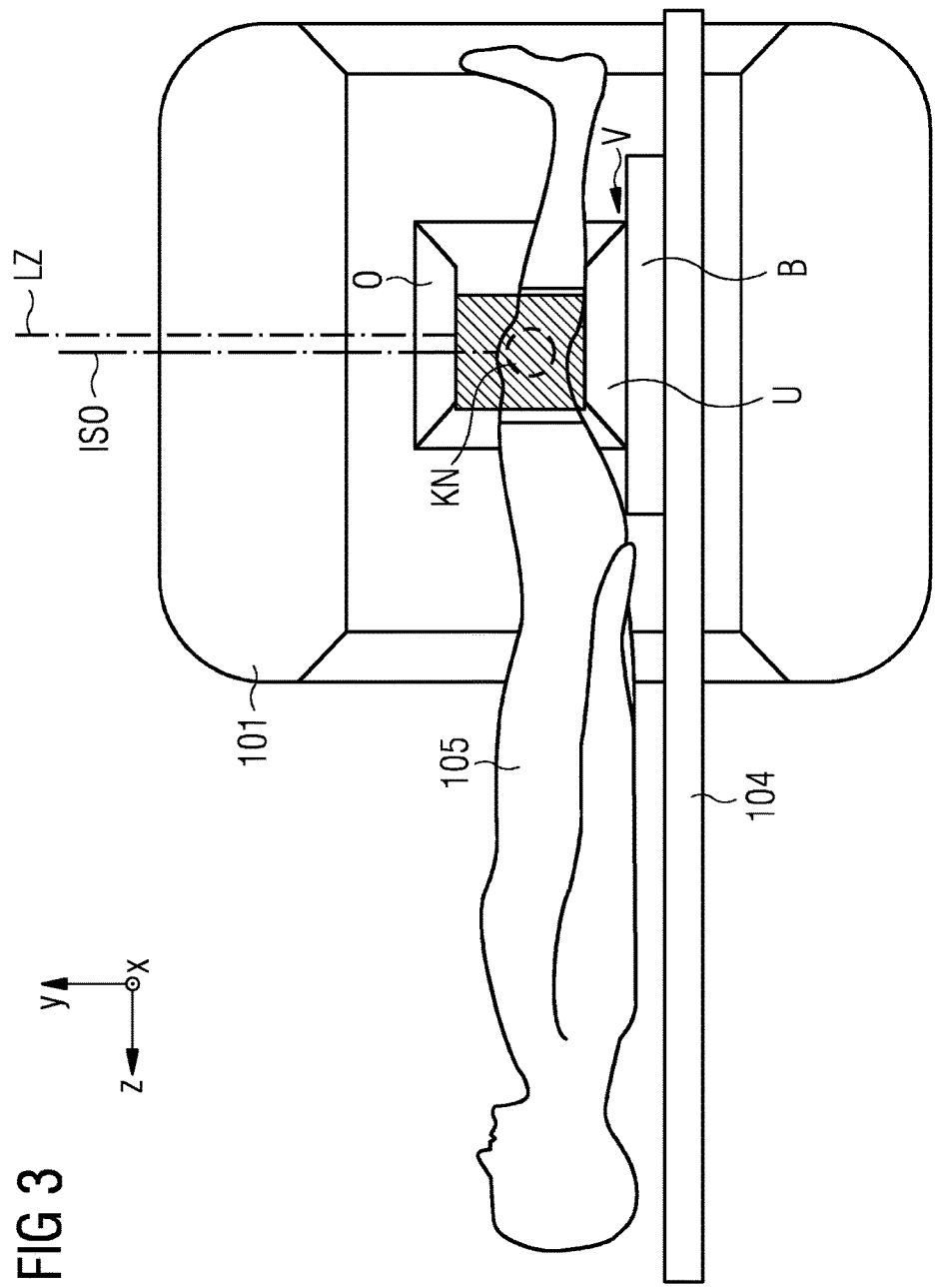
FIG. 3 depicts an example of a longitudinal section of a knee coil, wherein a knee is centered in the isocenter of a MRT, but not the knee coil.

FIG. 10 depicts an imaging magnetic resonance device MRT 101 contained in a shielded room or Faraday cage F.

The MRT 101 includes a hollow cylinder 102 having a tubular space 103 into which a patient couch 104 bearing a body, e.g., of an examination object 105 (e.g., a patient) (with or without local coil arrangement 106) may be introduced in the direction of and counter to the direction of the arrow Z so that images of the patient 105 may be generated by an imaging method. Disposed on the patient is a local coil arrangement 106, which may be used in a local region (also referred to as field of view or Field Of View or FoV or FOV) of the MRT to generate images of a subregion of the body 105 in the FOV. Signals of the local coil arrangement 106 may be evaluated (e.g., converted into images, stored or displayed) by an evaluation device (168, 115, 117, 119, 120, 121, etc.) of the MRT 101 that may be connected to the local coil arrangement 106, e.g., via coaxial cable or wirelessly (167), etc.

When a magnetic resonance device MRT 101 is used in order to examine a body 105 (e.g., an examination object or a patient) by magnetic resonance imaging, different magnetic fields coordinated with one another with the utmost precision in terms of their temporal and spatial characteristics are radiated onto the body 105. A strong magnet 107 (e.g., a cryomagnet) in a measurement chamber having a tunnel-shaped bore 103 generates a strong static main magnetic field $B_0$ ranging, e.g., from 0.2 Tesla to 3 Tesla or more. A body 105 to be examined, supported on a patient couch 104, is moved into a region of the main magnetic field $B_0$ that is approximately homogeneous in the area of observation FoV ("Field of View"). The nuclear spins of atomic nuclei of the body 105 are excited by way of magnetic radio-frequency excitation pulses $B_1(x, y, z, t)$, emitted via a radio-frequency antenna (and/or a local coil arrangement, if necessary), depicted here as a body coil 108 (e.g., multipart=108a, 108b, 108c). Radio-frequency excitation pulses are generated, e.g., by a pulse generation unit 109 controlled by a pulse sequence control unit 110. Following amplification by a radio-frequency amplifier 111, the pulses are directed to the radio-frequency antenna 108. The radio-frequency system depicted here is indicated only schematically. In certain embodiments, more than one pulse generation unit 109, more than one radio-frequency amplifier 111, and a plurality of radio-frequency antennas 108 a, b, c are used in a magnetic resonance device 101.

The magnetic resonance device 101 also has gradient coils 112x, 112y, 112z by which magnetic gradient fields $B_G(x, y, z, t)$ are radiated in the course of a measurement in order to provoke selective layer excitation and for spatial encoding of the measurement signal. The gradient coils 112x, 112y, 112z are controlled by a gradient coil control unit 114 (and, if appropriate, by way of amplifiers Vx, Vy, Vz) that, like the pulse generation unit 109, is connected to the pulse sequence control unit 110.

Signals emitted by the excited nuclear spins (of the atomic nuclei in the examination object) are received by the body coil 108a, b, c and/or at least one local coil arrangement 106, amplified by assigned radio-frequency preamplifiers 116, and further processed and digitized by a receive unit 117. The recorded measurement data is digitized and stored in the form of complex numeric values in a k-space matrix. An associated MR image may be reconstructed from the value-filled k-space matrix by a multidimensional Fourier transform.

For a coil, which may be operated in both transmit and receive mode, (e.g., the body coil 108 or a local coil 106), correct signal forwarding is regulated by an upstream duplexer 118.

From the measurement data, an image processing unit 119 generates an image that is displayed to a user via an operator console 120 and/or stored in a memory unit 121. A central computer unit 122 controls the individual system components.

In MR tomography as practiced today, images having a high signal-to-noise ratio (SNR) may be acquired by what are termed local coil arrangements (e.g., coils, local coils). These are antenna systems that are mounted in direct proximity on (anterior), below (posterior), next to, or in the body 105. In the course of a MR measurement, the excited nuclei induce a voltage in the individual antennas of the local coil, which voltage is then amplified by a low-noise preamplifier (e.g. LNA, preamp) and forwarded to the receive electronics. So-called high-field systems (e.g., 1.5 T-12 T or more) are used to improve the signal-to-noise ratio, even with high-resolution images. If more individual antennas may be connected to a MR receive system than there are receivers present, a switching matrix (also referred to as RCCS), for example, is incorporated between receive antennas and receivers. The array routes the currently active receive channels (e.g., those channels currently lying in the magnet's field of view) to the receivers present. This enables more coil elements to be connected than there are receivers available, since in the case of whole-body coverage it is only necessary to read out those coils that are located in the FoV or, as the case may be, in the homogeneity volume of the magnet.

The term local coil arrangement 106 may refer to an antenna system that may include one antenna element or a plurality of antenna elements (e.g., coil elements) configured as an array coil. These individual antenna elements are embodied, for example, as loop antennas (e.g., loops), butterfly coils, flex coils, or saddle coils. A local coil arrangement may include one or more of coil elements, a preamplifier, further electronics (e.g., standing wave traps, etc.), a housing, supports, or a cable with plug-type connector by which the local coil arrangement is connected to the MRT system. A receiver 168 mounted on the MRT system side filters and digitizes a signal received, e.g., wirelessly, etc., by a local coil 106 and passes the data to a digital signal processing device that may derive an image or a spectrum from the data acquired by a measurement and make it available to the user, e.g., for subsequent diagnosis by the user and/or for storage in a memory.

FIGS. 1-10 depict examples of details of local coils.

In certain embodiments, an ergonomic local coil is provided wherein the coil may be moved in the axial patient direction (e.g., in the patient longitudinal direction with the patient lying on a patient couch).

With the conventional technical and subsequently used terms relating to directions and axes, FIG. 9 depicts a patient axis that runs through a patient and/or an axis through the head and (e.g., middle of) the feet of a patient and/or the longitudinal axis of the patient couch of a MRT and/or "axial" and/or the "z" axis, and/or the "Z" axis.

FIG. 9 also depicts a transverse axis at right angles to the longitudinal axis and/or a horizontal axis and/or a horizontal axis at right angles to the longitudinal axis of the patient couch of a MRT and/or "lateral" and/or the "x"-axis and/or the "X" axis.

FIG. 9 further depicts a vertical axis of a coronal axis and/or a vertical axis at right angles to the longitudinal axis and/or vertical axis at right angles to the longitudinal axis of the patient couch of a MRT and/or the "y" axis and/or the "Y" axis.

MRT examinations of a knee KN may be implemented using a local RF (e.g., radio frequency) coil (also known as local coil), in order to achieve a good image quality (particularly also in respect of a signal-to-noise ratio="S/N").

Examples of local coils include, according to FIG. 1, a base plate B, which may have a fixed or stationary (e.g., latched or centered) position on a patient couch 104, a lower part U of the local coil 106, and an upper part O of the local coil 106 that may be placed on the lower part U (e.g., after a suitable positioning of the lower part U relative to the patient couch 104) (in which (O, U) transmit and/or receive antenna At, also referred to as coil elements, of the local coil 106 may also be disposed).

A space R in the form of, e.g., an opening or a tube is formed here between the upper part O and lower part U of the local coil 106, in which the body part to be examined (e.g., knee KN) of a patient 105 may be arranged for a MRT imaging.

With certain knee coils 106, a base plate B is offered with a lateral displacement option. A displacement in the axial patient direction on a patient couch 104 is however not provided.

According to certain embodiments, the lower part U of a local coil 106 may be displaced relative to the patient couch 104 and/or a base B of the local coil 106 along an axis (e.g., at least in the axial patient direction z) (or even more advantageously two axes x, z) by one or in each instance one displacement facility V.

Centering of a knee KN may be a requirement in clinical practice. The first attempt of centering the knee KN to be examined in the Field of View FoV and/or isocenter ISO of a MRT 101 (e.g., outside of the ISO in the head-foot direction (+−z) by approx. 20-80 mm) may be inadequate and the position may then be corrected prior to MRT imaging. Since a complete knee coil (e.g., with its base plate) may possibly not be moved in the head-foot direction z (+z or −z), the reclining patient 105, who possibly may not be able to see the knee KN in the local coil 106, may be instructed to move to and fro automatically on the patient couch 104 based on instructions from an operator (e.g., clinical support personnel). This correction procedure may cost MRT scanner time and may be challenging to patients (such as for instance weak patients, heavy patients, sedated patients, hard-of-hearing patients, patients who have already inserted earplugs) and also operators. The positioning, which may be executed under time pressure, may end here with a suboptimal compromise.

Moreover, with some knee local coils, the problem may occur that a knee KN to be examined is too large for the tubular opening R (e.g., formed between the upper part O and the lower part U of a local coil for instance), and the cover of the local coil 106, in the form of its upper part, may not be closed (or that a connection error occurs). In this case, the patient 105 is also instructed, for instance, to move in the head direction (+z) on the patient couch 105 in order to move the knee KN out of the tubular opening R (formed between the upper part O and the lower part U for instance) until the local coil 106 may be closed (e.g., by laying the upper part O onto the lower part U).

The correct location of the desired anatomical center AZ (of the region to be examined, e.g., axis through the center or center of the knee KN) with for instance a light marker may be difficult since the local coil cover is closed across the lower part U in the form of the upper part O. This thus differentiates, if applicable, a marking of a local coil center LZ (in the center (e.g., middle) of the local coil 106), which is to be positioned in the isocenter ISO during a MRT imaging and the anatomical center AZ of the region to be examined (e.g., of the knee KN). Even when attempting to position a light marker exactly on the center of a non-centered knee KN in a local coil 106, and to center this position in the isocenter ISO of the magnet 102 of a MRT 101, the knee KN may still remain outside of the center LZ (e.g., the center point along one or two horizontal axes x, z of the local coil 106).

Certain MRT systems offer a so-called "autopositioning" feature (which may be translated, for instance, as an autopositioning function) for knee local coils that have a predetermined z-position on a patient couch. By an operator pressing a "[center]" (which may be translated, for instance, as centering) button, such a system 101 may move a patient couch 104 such that the center LZ of the local coil is exactly in the isocenter ISO of the magnet of the MRT 101. In this case, the anatomic center AZ of the knee KN in the local coil 106 may also still remain outside of the LZ center of the local coil 106.

Figure 4:
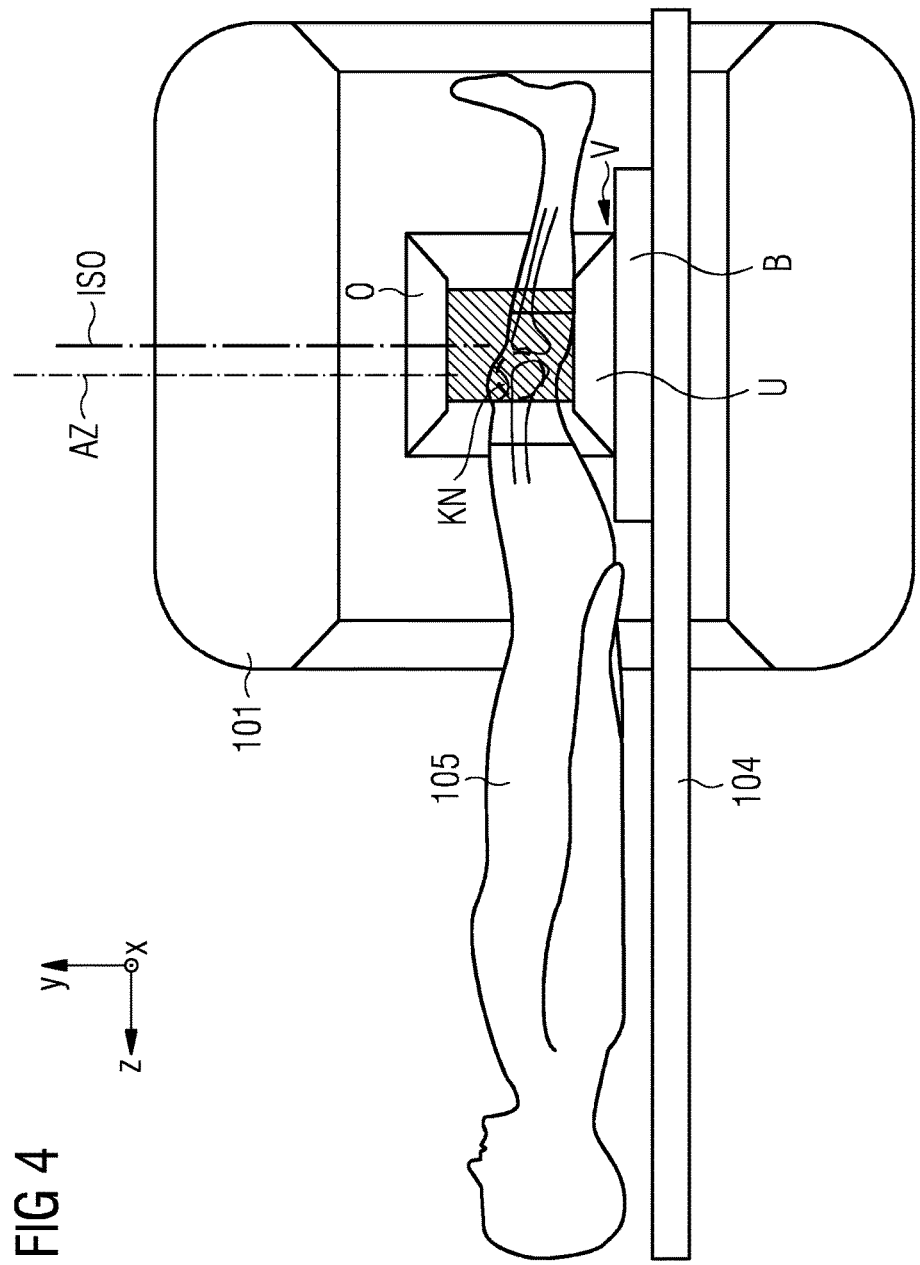
FIG. 4 depicts an example of a longitudinal section of a knee coil, wherein the knee coil is centered in the isocenter of a MRT, but not a knee therein.

If the anatomical center AZ of the knee KN under examination (as in FIG. 3) is not sufficiently as good in the center LZ of the (knee-) local coil 106 and/or if, according to FIG. 4, the anatomical center AZ in the form, e.g., of the middle of the knee KN under examination is not sufficiently good in the isocenter ISO of the magnet of the MRT 101, several effects may occur in the MRT imaging, such as the following. (A) For subareas of the knee KN, a significant signal loss may occur. Even with good normalization, the resulting S/N may be inadequate. (B) MRT signals from less significant or insignificant anatomical areas around the knee KN may generate fold artifacts. These artifacts may be suppressed using special scan techniques (e.g., Sat-Band, oversampling, deactivation of local coil elements), but these techniques require expertise and time for implementation and/or additional measuring time on the MRT. (C) The anatomical region (KN) under examination or relevant anatomical landmarks (e.g., points) may possibly not be covered during the first localization scan (e.g., an auto align 3D scout) in the isocenter ISO. As a result, problems may occur during the workflow and the user of the MRT may be requested to intervene and to optimize the situation as well as possible according to the user's experience.

According to certain procedures, if the patient 105 is able to respond appropriately, the operator may attempt to instruct him as to how he is to correct the position of his knee KN in the knee local coil 106 by axially moving the body of the patient 105 on the patient couch 104 upwards (in the head direction, in other words in the z or +z direction) or downwards (in the direction of the feet, in other words in the −z direction), until the knee KN appears to be adequately centered in the local coil 106, whereupon the operator is able to close the upper part O on the lower part U of the local coil 106 in order to fix the knee KN therein, e.g., by a stopping apparatus (e.g., with bolts and recesses or clamps, etc.).

If the upper part O is not able to be placed on the lower part U in order to close the local coil 106, the operator of the MRT may in turn instruct the patient 105 as to how the patient is now to move in order to correct this problem. By setting a light marker on the center AZ of the knee anatomy (e.g., a good reference area may be the lower limit of the patella of the second knee of the patient), the knee KN under examination may be centered in the isocenter ISO of the magnet of the MRT 101.

For an excessively large knee, over which the upper part O of the local coil 106 may not be closed, the knee local coil may be removed from the patient couch 104 and (e.g., a large flexible local coil or body matrix coil) or other extremity local coil (e.g., a TxRx extremity local coil) may instead be used by a flexible, so-called "flex" local coil. This may likewise produce workflow effort if the examination protocols of the MRT 101 have to be adjusted thereto (e.g., by selecting the local coil elements, ipat, oversampling, etc., in the MRT controller).

According to an embodiment (e.g., FIG. 5 and/or FIG. 6 and/or FIG. 7), a local coil 106 (e.g., for a knee KN) may be adjustable in the direction of the horizontal axis z (+z and −z, e.g., in the direction of the head and/or foot of the patient on a patient couch 104) and/or to this end in a perpendicular horizontal direction according to axis x (in other words, +x and opposite −x, in respect to the patient lying on the patient couch to the right or left) and/or may be moved (relative to the patient couch 104 and/or relative to the base B of the local coil 106).

In certain embodiments, the lower part U of a local coil 106 may be moved in the direction of the axis z (+z and −z, in FIG. 6, e.g., in the direction of the head and/or foot of the patient on a patient couch) relative to the base B of the local coil 106, without the patient 105 automatically moving on the patient couch 104 so as to move the anatomical center AZ to be examined (e.g., the knee KN) of the patient 105 into the center LZ of the local coil 106, e.g., before the patient couch 104 with the patient 105 is moved into the bore 103 of the MRT 101.

In certain embodiments, the lower part U of a local coil 106 may also be moved in the direction of axis x (e.g., in the direction +x and opposite to direction −x in FIG. 6, to the right or left in respect of the patient lying on the patient couch), on the basis B of the local coil 106, without the patient 105 on the patient couch 104 moving so as to move the anatomical center AZ to be examined (e.g., the knee KN) of the patient 105 and the center LZ of the local coil 106 closer to the center of the patient couch 104, e.g., before the patient couch 104 with the patient 105 is moved into the bore 103 of the MRT 101, or also in the case of a patient 105 moved into the bore 103 of the MRT 101.

Figure 5:
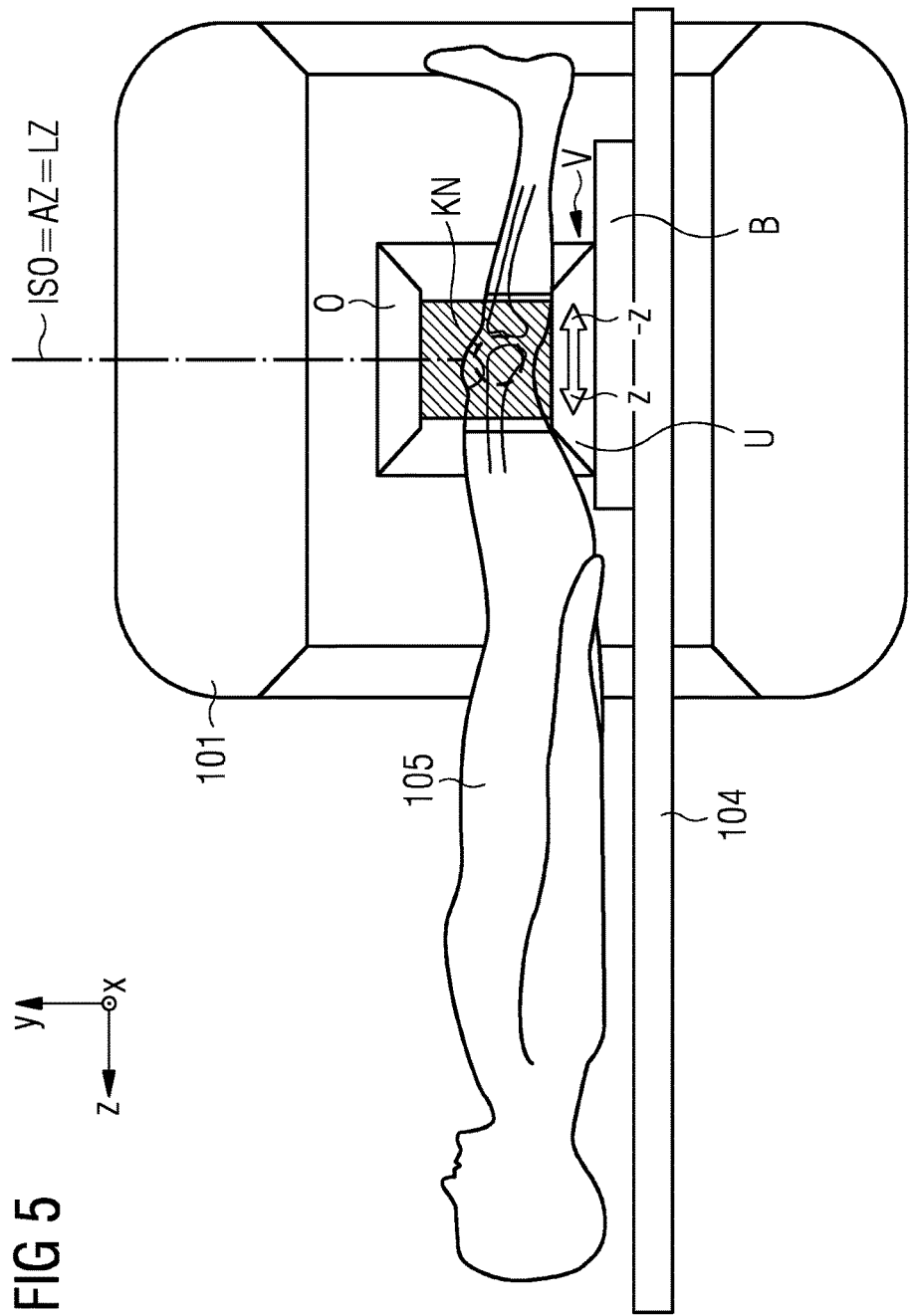
FIG. 5 depicts and example of a longitudinal section of a knee coil that may be displaced, in particular, in the axial direction with a knee therein, on a patient couch of a MRT.
Figure 6:
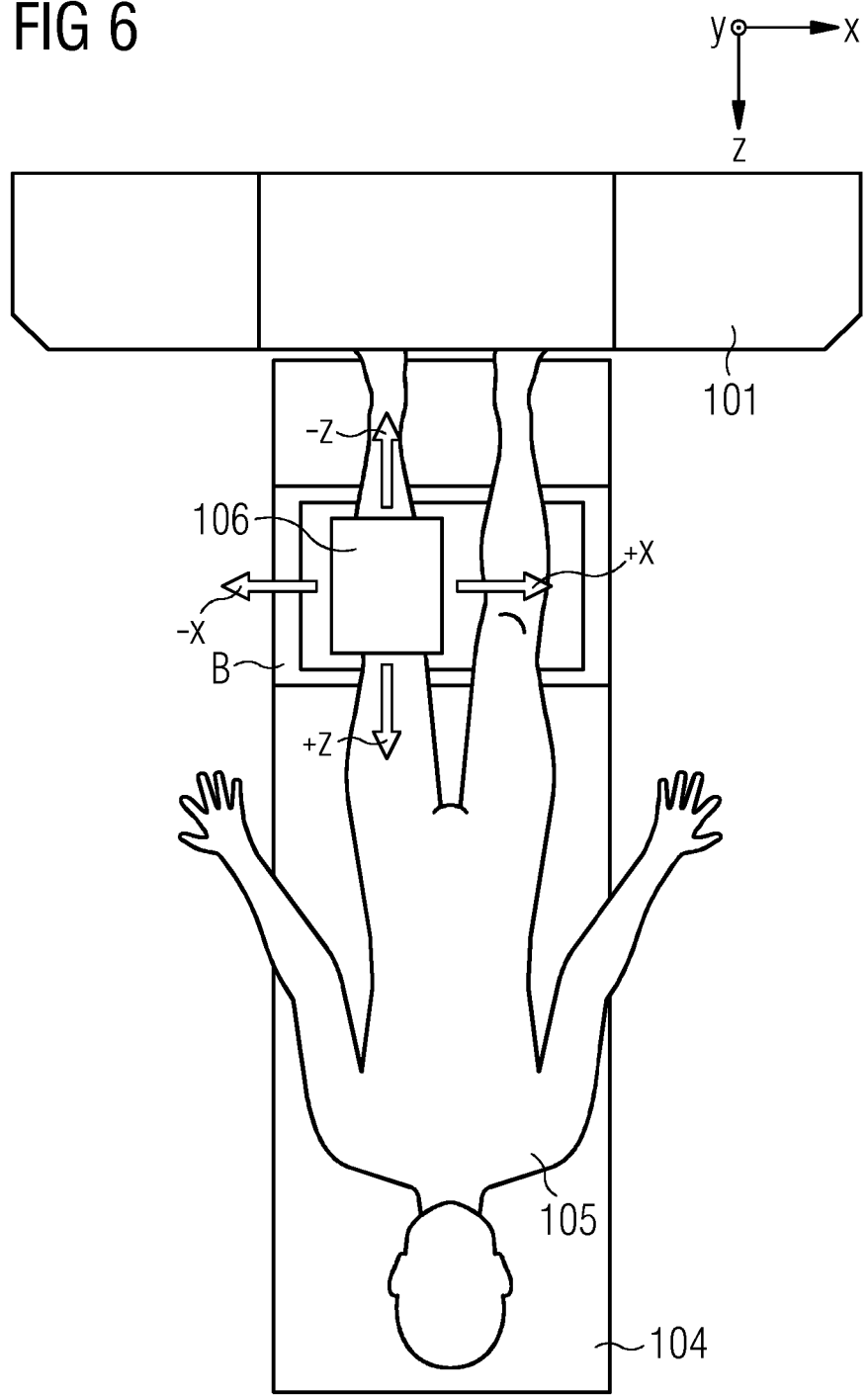
FIG. 6 depicts an example of a top view of a knee coil that may be displaced in the axial and lateral direction with a knee therein, on a patient couch of a MRT.

In certain embodiments, in FIG. 5 the base B (e.g., plate) of the local coil 106, when the patient 105 is introduced into the bore 103 of the MRT 101, is in the +z direction (without any significant disadvantage) outside of the isocenter ISO of the magnet of the MRT 101, but the anatomical center AZ to be examined (e.g., the knee KN) of the patient 105 and also the center LZ of local coil 106 are both in the isocenter ISO of the magnet of the MRT 101.

In order to prevent movement artifacts (e.g., by moving the anatomical region AZ to be examined relative to the local coil 106 and/or to the MRT 101), it is advantageous if the examination unit, including the space R (e.g., tubular and formed between the upper part O and the lower part U) and the anatomical region AZ to be examined (e.g., the knee KN) is (e.g., locally) stable during a MRT imaging, since even a few millimeters of movement may significantly impair the quality of the MRT image. It is therefore advantageous if the displacement mechanism V of the local coil 106 may be blocked. It may also be advantageous if the displaceability V of the local coil automatically blocks in the current position, as soon as the upper part O of the local coil 106 (e.g., on the lower part U) is pushed.

A local coil 106 that may be moved at least along the axial patient direction z, and also in the lateral direction, x by at least one displacement facility V for, e.g., a knee may have the following advantages: (1) no need to correct a first roughly determined position of a patient 105 on a patient couch 105; (2) reduced complexity of the centering of the anatomy AR of a knee; (3) increased image quality for knee examinations on account of fewer required compromises; and/or (4) scanner time is saved with each MRT examination, e.g. of a knee.

Figure 7:
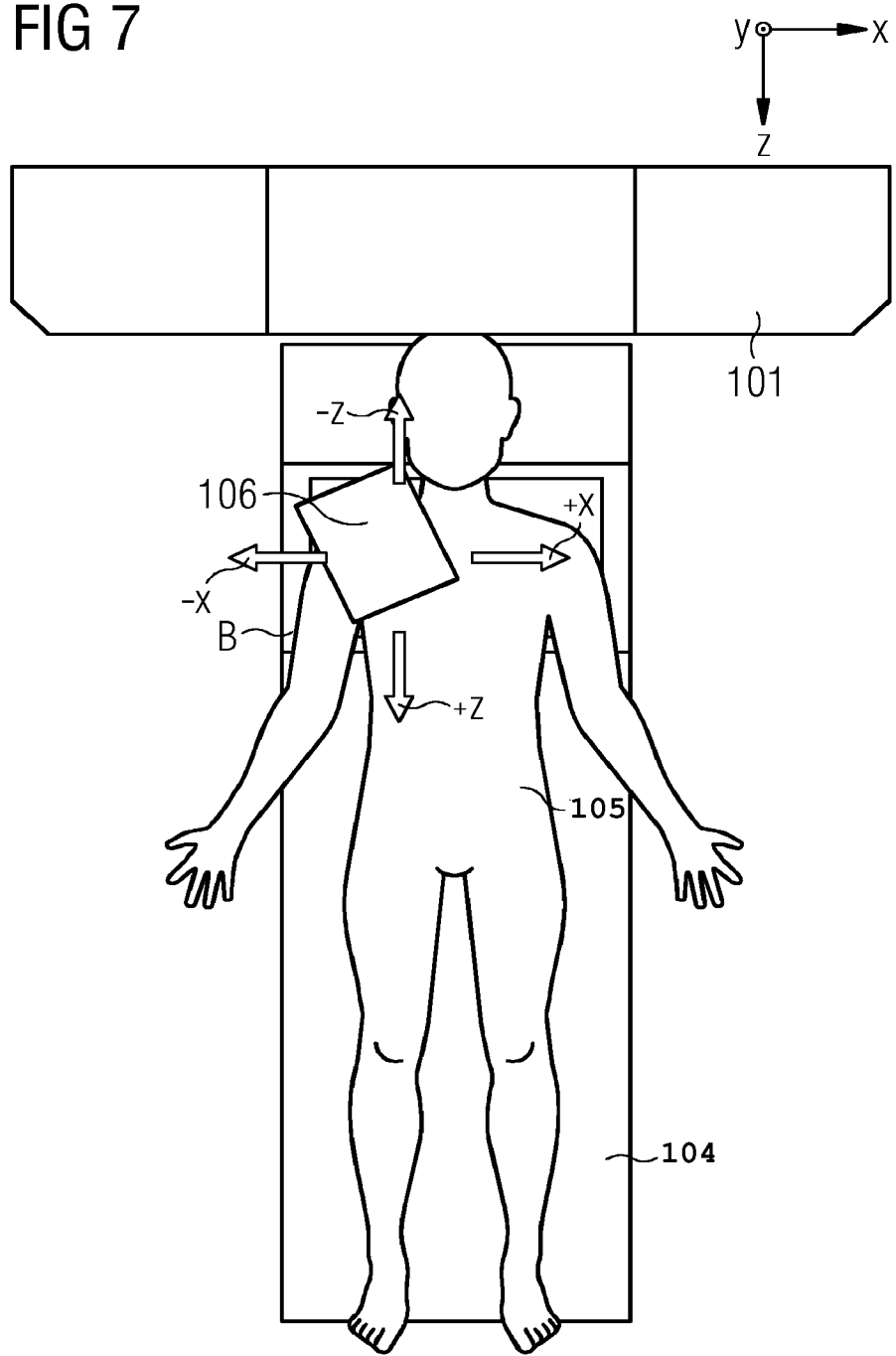
FIG. 7 depicts an example of a top view of a shoulder coil that may be displaced in the axial and lateral direction with a shoulder therein, on a patient couch of a MRT.
Figure 8:
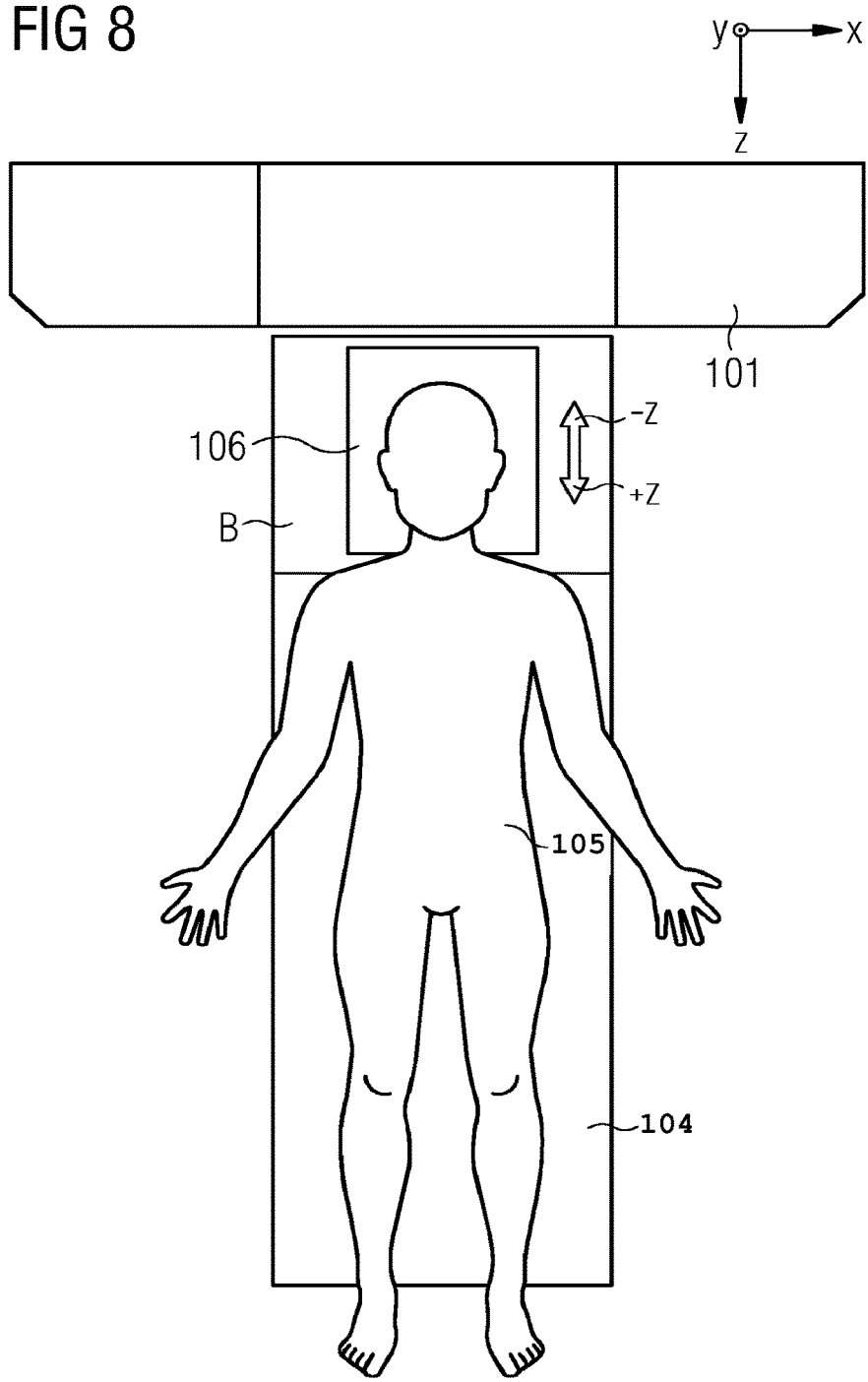
FIG. 8 depicts an example of a top view of a head coil that may be displaced in the axial direction with a head therein, on a patient couch of a MRT.

As depicted in FIG. 7 for a local coil 106 for a shoulder and FIG. 8 for a local coil 106 for a head, embodiments are also possible for shoulder coils, head coils and head-neck coils.

A local coil 106 also depicted in FIG. 7 and/or in FIG. 8 may be moved along an axis z (+z, −z) or along two axes x, z (+x, −x and +z, −z).

A displacement facility V for moving a part (U; or U and O together) relative to a part (such as a base B) of a local coil 106 and/or relative to a patient couch 104 may include surfaces lying on top of each other or parts lying on top of each other that may be moved relative to one another (e.g., lower part U on base B) of the local coil 106, or provision may be made for instance for a ball bearing or roller bearing or groove-spring mechanism, etc., for a movement along at least one axis, and/or provision may be made for instance as a further displacement facility V for a ball bearing or roller bearing or groove-spring mechanism etc. for a movement along at least one further axis.

According to an embodiment, a local coil 106 may also be provided without a base plate B but with a stable base, etc. (e.g., in extremity coils). A local coil 106 of this type may be arranged anywhere on a patient couch 104. The position of the local coil 106 may be easily and intuitively adjusted to a patient 105, who is already lying on the patient couch 104, and this type of local coil may be used for other anatomical regions, (e.g., an ankle or elbow).

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for an imaging magnetic resonance tomography (MRT) system, the local coil comprising:
   a lower part configured to be positioned on a patient couch of the magnetic resonance tomography system;
   an upper part configured to be positioned on the lower part, wherein the upper part and the lower part provide a space for receiving a body part of a patient to be examined; and
   at least one displacement facility configured to displace at least one part of the local coil along at least one axis, wherein the at least one displacement facility is configured to be automatically stopped in a current position, by a stopping facility, by placing the upper part of the local coil onto the lower part of the local coil.

2. The local coil as claimed in claim 1, wherein the displacement of the at least one part of the local coil is along one or more of a horizontal patient axis, a patient longitudinal axis, or an axial direction.

3. The local coil as claimed in claim 1, wherein the local coil is a knee coil, a shoulder coil, or a head coil.

4. The local coil as claimed in claim 1, wherein the at least one displacement facility is two displacement facilities, and the displacement of the at least one part of the local coil is along one of two axes relative to another part of the local coil, a patient couch, or the another part of the local coil and the patient couch.

5. The local coil as claimed in claim 1, wherein the at least one displacement facility comprises one or two displacement facilities, and the displacement is along one of two axes respectively that are orthogonal to one another.

6. The local coil as claimed in claim 1, wherein the at least one displacement facility comprises one or two displacement facilities in each instance for the displacement of the at least one part of the local coil along one of two horizontal axes that are orthogonal to one another, allowing for displacement in both a first direction and a second direction opposite to the first direction.

7. The local coil as claimed in claim 1, wherein the at least one displacement facility comprises one or two displacement facilities in each instance for the displacement of the at least one part of the local coil along one of two axes, which, with the use of the local coil, are both horizontal in the magnetic resonance tomography system.

8. The local coil as claimed in claim 1, further comprising a base plate positioned below the lower part of the local coil.

9. The local coil as claimed in claim 1,
   wherein the local coil has no base plate below the lower part of the local coil.

10. The local coil as claimed in claim 8, wherein the at least one displacement facility comprises two displacement facilities in each instance for the displacement of the base plate and the lower part of the local coil relative to one another along a patient axis.

11. The local coil as claimed in claim 1, further comprising:
    a base positioned below the lower part of the local coil,
    wherein the at least one displacement facility comprises the lower part resting in a planar fashion on the base and in the base, and
    wherein the lower part is displaceable relative to the base.

12. The local coil as claimed in claim 1, wherein the at least one displacement facility comprises parts being displaceable relative to one another by one or more of rails, contact surfaces, a groove, a spring, or ball bearings.

13. The local coil as claimed in claim 1, wherein the at least one displacement facility comprises at least one antenna along at least an axial patient axis.

14. The local coil as claimed in claim 1, wherein the displacement is in at least an axial patient direction of at least the lower part of the local coil relative to a base of the local coil upon which the lower part and the upper part of the local coil are configured to be placed, wherein the lower part, the upper part, or the lower part and the upper part comprise at least one antenna.

15. The local coil as claimed in claim 1, wherein the axis is a patient axis.

16. The local coil as claimed in claim 1, wherein the axis runs through a space in a form of an opening to receive the body part of the patient.

17. The local coil as claimed in claim 1, wherein the axis is a recess for receiving a knee of the patient.

18. The local coil as claimed in claim 1, wherein the axis proceeds at right angles through a neck opening of a head coil.

19. The local coil as claimed in claim 1, wherein the axis runs in parallel to a bore of the MRT, a patient couch, or the bore of the MRT and the patient couch when used in the MRT, on the patient couch, or in the MRT and on the patient couch.

20. The local coil as claimed in claim 1, wherein the axis is parallel to a patient longitudinal axis of the patient resting on the patient couch.

* * * * *